United States Patent
Kuba et al.

(10) Patent No.: US 12,020,895 B2
(45) Date of Patent: Jun. 25, 2024

(54) SYSTEMS AND APPARATUSES FOR CONTAMINATION-FREE VACUUM TRANSFER OF SAMPLES

(71) Applicant: FEI Company, Hillsboro, OR (US)

(72) Inventors: Jakub Kuba, Brno (CZ); John M. Mitchels, Brno (CZ); Jakub Drahotský, Brno (CZ); Michal Valík, Brno (CZ)

(73) Assignee: FEI Company, Hillsboro, OR (US)

( * ) Notice: Subject to any disclaimer, the term of this patent is extended or adjusted under 35 U.S.C. 154(b) by 63 days.

(21) Appl. No.: 17/666,385

(22) Filed: Feb. 7, 2022

(65) Prior Publication Data

US 2023/0253176 A1 Aug. 10, 2023

(51) Int. Cl.
*H01J 37/18* (2006.01)
*H01J 37/28* (2006.01)
*G01N 1/42* (2006.01)

(52) U.S. Cl.
CPC ............ *H01J 37/185* (2013.01); *H01J 37/28* (2013.01); *G01N 1/42* (2013.01); *H01J 2237/184* (2013.01); *H01J 2237/186* (2013.01)

(58) Field of Classification Search
CPC .. H01J 37/00; H01J 37/02; H01J 37/26; H01J 37/28; H01J 37/185; H01J 37/20; H01J 2237/184; H01J 2237/186; H01J 2237/2002; H01J 2237/2003; H01J 2237/208; H01J 49/0409; G01N 1/42
USPC ........... 250/306, 307, 310, 311, 492.1, 492.2
See application file for complete search history.

(56) References Cited

U.S. PATENT DOCUMENTS

| | | | | |
|---|---|---|---|---|
| 4,838,990 | A * | 6/1989 | Jucha | H01J 37/32339 216/75 |
| 4,950,901 | A * | 8/1990 | Jones | H01J 37/20 62/51.1 |
| 7,034,316 | B2 | 4/2006 | Wagner et al. | |
| 7,767,979 | B2 | 8/2010 | Dona | |
| 7,989,778 | B2 | 8/2011 | Oetelaar et al. | |
| 9,837,246 | B1 | 12/2017 | Geurts et al. | |
| 2019/0180974 | A1* | 6/2019 | Rémigy | H01J 37/20 |
| 2022/0216030 | A1* | 7/2022 | Naganuma | H01J 37/30 |
| 2022/0223394 | A1* | 7/2022 | Westphall | G01N 1/42 |

OTHER PUBLICATIONS

Filing Receipt issued in U.S. Appl. No. 17/523,246, dated Nov. 24, 2021, 4 pages.

(Continued)

*Primary Examiner* — Jason L Mccormack
(74) *Attorney, Agent, or Firm* — Klarquist Sparkman, LLP

(57) ABSTRACT

Various approaches are provided for contamination-free vacuum transfer of samples. As one example, an apparatus includes a compartment configured to store multiple samples held by a cartridge removably coupled to the compartment, a sample port for transferring the cartridge between a charged particle system and a position within the compartment, and a valve configured to seal the compartment at vacuum pressure during transport of the multiple samples between charged particle systems. In this way, samples such as lamellae may be transferred between charged particle systems while maintaining the samples at vacuum pressure, thereby reducing the possibility of sample contamination during sample transfer.

19 Claims, 9 Drawing Sheets

(56) References Cited

OTHER PUBLICATIONS

Tacke et al., "A Streamlined Workflow for Automated Cryo Focused Ion Beam Milling," BioRxiv, Preprint, pp. 1-28 (Feb. 26, 2020), https://doi.org/10.1101/2020.02.24.963033.

Tacke et al., "A Streamlined Workflow for Automated Cryo Focused Ion Beam Milling," *Journal of Structural Biology*, vol. 213, Issue 3, pp. 1-10, 107743 (Sep. 2021).

* cited by examiner

SYSTEMS AND APPARATUSES FOR CONTAMINATION-FREE VACUUM TRANSFER OF SAMPLES

FIELD

The field is transfer of samples between charged particle systems under vacuum, and more particularly to vacuum transfer of multiple samples between transmission electron microscopes and scanning transmission electron microscopes.

BACKGROUND

Samples for electron microscope imaging may be prepared for observation under transmitted light or electron radiation. For example, a thin slice of a sample, also referred to as a lamella, or a cylinder sample, referred to as a pillar, may be cut or milled from a bulk sample in a grid to a desired thickness suitable for observation with a transmission electron microscope (TEM). In a TEM, an electron beam impacts the sample, and electrons transmitted through the sample form an image of the sample. As such, the sample must be sufficiently thin to allow enough electrons of an electron beam to travel through the sample. For example, lamellae are typically less than 200 nm thick and are often much thinner. For lamella preparation, the cutting or milling can be performed by a focused ion beam (FIB) system, or within a dual beam system that includes both a FIB and an electron microscope. The electron microscope of such a dual beam system may comprise a scanning electron microscope (SEM), wherein the SEM focuses a primary electron beam on a sample, detects secondary electrons emitted from the surface of the sample, and forms an image according to the detected secondary electrons. In this way, the SEM obtains information regarding the surface and composition of the sample. With a dual beam system, imaging via the SEM may thus be used to improve the precision of milling and other processes, such as deposition and ablation, by the FIB during lamella preparation. After preparing the lamella using an FIB system or a dual beam system including an FIB and an SEM, the sample may be transferred to a TEM for imaging the sample to obtain information regarding the inner structure of the sample, such as crystal structure, morphology, and stress state information.

SUMMARY

Various approaches are provided for contamination-free vacuum transfer of samples between charged particle systems. As one example, an apparatus may comprise a first portion including a compartment configured to store multiple samples held by a cartridge removably coupled to the compartment, a second portion fixedly attached to the first portion and configured to removably couple to a charged particle system, the second portion including a sample port for transferring the cartridge between the charged particle system and a position within the compartment, and a valve configured to seal the compartment at vacuum pressure during transport of the multiple samples between charged particle systems. The apparatus may further comprise a reservoir configured to store cryogenic liquid, wherein the reservoir is in thermal communication with the compartment. In this way, samples such as lamellae may be transferred between charged particle systems while maintaining the samples at vacuum pressure and cryogenic temperatures without directly exposing the samples to cryogenic liquid, thereby reducing the possibility of sample contamination during sample transfer.

The foregoing and other objects, features, and advantages of the disclosed technology will become more apparent from the following detailed description, which proceeds with reference to the accompanying figures.

DETAILED DESCRIPTION

Figure 1:
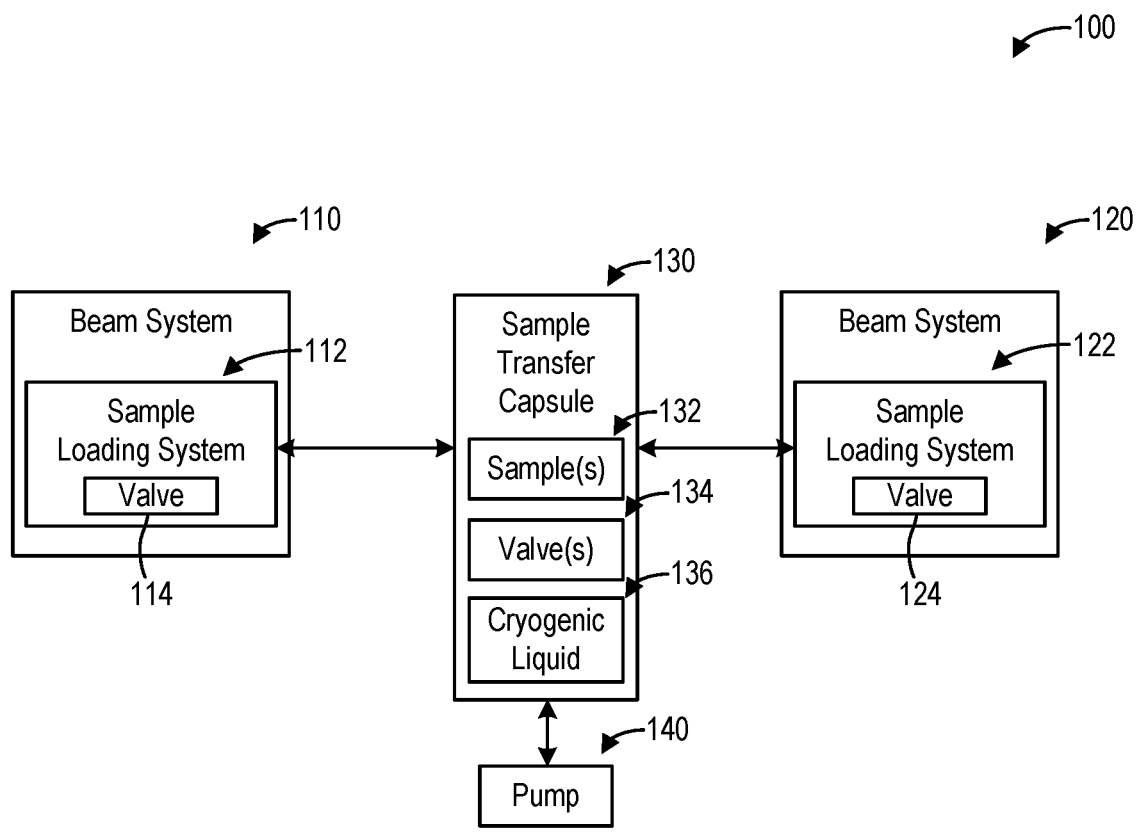
FIG. 1 shows a block diagram illustrating an example system for transferring a sample between beam systems, according to an example.

The present disclosure relates to transferring samples between sample processing systems, such as charged particle beam systems. In particular, systems, apparatuses, and methods for contamination-free vacuum transfer of samples between charged particle beam systems are provided. While samples may be carefully prepared under vacuum in a charged particle beam system, also referred to herein simply as a charged particle system, such samples may be contaminated through exposure to atmosphere during transfer to another charged particle system for additional imaging. Further, such samples are typically plunged into a cryogenic liquid such as liquid nitrogen during transfer. Applicant recognizes that the direct contact between the samples and the cryogenic liquid during the sample transfer may contaminate the samples and introduce artifacts in the samples. For example, ice particles in liquid nitrogen may land on the sample prepared by FIB milling and reduce or even completely cover the region of interest on the sample, which results in the sample being unsuitable for analysis in TEM. Such sample contamination is especially prominent if the sample is protruding or sticking out of the TEM grid, such as a pillar-shaped sample. Therefore, a system for transferring samples between charged particle systems, such as the system depicted in FIG. 1, may include a sample transfer capsule configured to store samples at vacuum pressure and at cryogenic temperatures but without directly exposing the samples to cryogenic liquid. Further, the sample transfer capsule may couple to a charged particle system, such as the charged particle system depicted in FIG. 2, via a sample loading system, wherein the coupling of the sample transfer capsule and the sample loading system allows the sample to be maintained at the vacuum pressure during transfer between the capsule and the charged particle system.

A sample transfer capsule, such as the sample transfer capsules depicted in FIGS. 3-6, may include an interior region or compartment for storing samples during transfer. An upper portion of the sample transfer capsule may be coupled to the sample loading system of the charged particle system. A sample cartridge for holding multiple samples may be automatically loaded into and/or removed from the interior region or compartment of the sample transfer capsule via an opening (e.g., sample port 312 in FIG. 3) at the top of the sample transfer capsule using the sample loading system. The sample cartridge may be removably coupled to a sample holder at the bottom of compartment. The compartment is kept under vacuum environment during the sample transfer so that the sample is not in contact with any cryogenic liquid. The samples held by the sample cartridge may be actively cooled in the compartment by actively cooling the sample holder. For example, the sample transfer capsule includes a cryogen reservoir in thermal communication with the samples via the sample holder. The sample transfer capsule is maintained in an upright position during the sample transfer while the transfer capsule stores cryogenic liquid in the reservoir. The sample transfer capsule further includes a valve for sealing the compartment at the vacuum pressure. The cryogen reservoir is typically not sealed in order to allow pressure venting while cryogenic liquid is stored therein. The cryogen reservoir may be positioned coaxial with and surrounding the compartment. In some examples, the cryogen reservoir may not be coaxial with the sample storage compartment, for example as depicted in FIG. 7, though thermal conduction between the cryogen reservoir and the samples in the compartment may still occur through a common base plate. In some examples, the sample transfer capsule does not include a reservoir, and the samples may be maintained low temperature for a limited time during the sample transfer. Methods for transferring samples between a sample transfer capsule and a beam system, such as the methods depicted in FIGS. 8 and 9, include selectively controlling valves to allow evacuation of an airlock formed between the sample transfer capsule and the beam system and the subsequent transfer of samples through the evacuated airlock. The sample transfer capsules provided herein thus allow the transfer of samples at a desired pressure and a desired temperature without directly exposing the samples to atmosphere or cryogenic liquids, thus reducing the possibility of sample contamination during transfer. For example, by maintaining the samples at vacuum pressure during transfer, phase changes that may occur during transfer of a sample between sample processing systems due to depressurization or immersion in cryogenic fluid can be avoided. Example transfers between systems can include transfer between beam systems, such as a sample preparation system (including a FIB/SEM) and a sample analysis system (such as a TEM), between analysis systems, between storage systems, etc. In many examples herein, systems storing or receiving the transferred samples have compatible sample loading systems configured to store and/or retrieve the samples to and/or from the same sample transfer capsule.

Turning now to the drawings, FIG. 1 shows a block diagram illustrating an example system 100 for transferring a sample between beam systems, such as a first beam system 110 and a second beam system 120. The beam systems 110 and 120 may comprise different types of electron microscopes, including but not limited to a transmission electron microscope (TEM), a scanning electron microscope (SEM), a reflection electron microscope, a scanning transmission electron microscope (S/TEM), a low-voltage electron microscope, and so on. Additionally, one or more of the beam systems 110 and 120 may comprise a dual beam system, such as a focused ion beam (FIB)/SEM system. As an illustrative and non-limiting example, the first beam system 110 may comprise an FIB/SEM for preparing samples while the second beam system 120 may comprise a TEM for analyzing the samples prepared with the first beam system 110. In further examples, one or both of the beam systems 110, 120 can be replaced with other sample processing systems, such as storage systems.

One or more samples 132 may be transferred from the first beam system 110 to the second beam system 120, for example, via a sample transfer capsule 130. To that end, the first beam system 110 includes a sample loading system 112 configured to automatically load the one or more samples 132 from the first beam system 110 to the sample transfer capsule 130, and similarly to automatically load the one or more samples 132 from the sample transfer capsule 130 to the first beam system 110. Further, the second beam system 120 includes a sample loading system 122 configured to automatically load the one or more samples 132 from the sample transfer capsule 130 to the second beam system 120, and similarly to automatically load the one or more samples 132 from the second beam system 120 to the sample transfer capsule 130.

The sample transfer capsule 130 is configured to maintain the sample(s) 132 at a target pressure and a target temperature. To that end, the sample transfer capsule 130 may include one or more valve(s) 134 configured to close and thus seal the sample(s) 132 within the sample transfer capsule 130 at a vacuum pressure as described further herein. Further, the sample transfer capsule 130 stores cryogenic liquid 136 to maintain the sample(s) 132 at the target temperature. As the sample(s) 132 are sealed within the sample transfer capsule 130 at vacuum pressure, the cryogenic liquid 136 is stored within the sample transfer capsule 130 in a chamber separate from the sample(s) 132. The sample transfer capsule 130 thus includes an interior region (not shown) for storing the sample(s) 132 as well as a separate cryogen reservoir (not shown) for storing cryogenic liquid 136 and relieving pressure as the cryogenic liquid 136 evaporates. The samples in the interior region and the cryogen reservoir may be in thermal contact, as discussed further herein, so that the cryogenic liquid 136 may actively cool the sample(s) 132 in the interior region of the sample transfer capsule 130. In this way, the sample(s) 132 may be maintained at cryogenic temperatures without directly exposing the sample(s) 132 to the cryogenic liquid 136, which may introduce contamination in the sample(s) 132.

The chambers of the beam systems 110 and 120 wherein the sample(s) 132 are positioned for imaging may be evacuated via a vacuum system (not shown) to provide the chambers with a vacuum. In this way, contamination of the sample(s) 132 due to atmospheric gases, for example, while loading into the beam systems 110 and/or 120 may be minimized. To further minimize the exposure of the sample(s) 132 to atmospheric gases, for example during transfer of the sample(s) 132 from the first beam system 110 to the second beam system 120, the sample transfer capsule 130 may be evacuated to provide an interior region or compartment of the capsule with a vacuum. As an example, to evacuate an interior region or compartment of the sample transfer capsule 130 wherein the sample(s) 132 are stored, the system 100 may include a pump 140, such as a vacuum pump, that couples to the sample transfer capsule 130. The pump 140 may couple to the sample transfer capsule 130 via a hose, for example. The system 100 may include one or more pumps 140 such as the pump 140 that is independent of the beam systems 110 and 120 as depicted. Additionally or alternatively, the system 100 may include one or more of a pump such as the pump 140 integrated into the sample loading system 112 of the first beam system 110 and/or integrated into the sample loading system 122 of the second beam system 122. The pump 140 may pump atmospheric gases out of the interior region of the sample transfer capsule 130 storing the sample(s) 132 such that the pressure of the interior region is a vacuum pressure consistent with the vacuum pressure of the chambers of the beam system 110 and/or the beam system 120.

Further, the sample loading system 112 may include a valve 114 adjustable from a closed state to an open state, wherein the chamber of the first beam system 110 is sealed from atmosphere when the valve 114 is in the closed state and unsealed via the valve 114 when the valve 114 is in the open state. The sample transfer capsule 130 may also include a valve 134 adjustable from a closed state to an open state, wherein the interior region or compartment of the sample transfer capsule 130 storing the sample(s) 132 is sealed from atmosphere when the valve 134 is in the closed state and unsealed via the valve 134 when the valve 134 is in the open state. The valve 114 and/or the valve 134 of the beam system 110 and the sample transfer capsule 130, respectively, may selectively open and close to allow the transfer of the sample(s) 132 between the beam system 110 and the sample transfer capsule 130, for example. As one illustrative and non-limiting example, to load or unload the sample(s) 132 between the beam system 110 and the sample transfer capsule 130, the sample transfer capsule 130 couples to the beam system 110 via the sample loading system 112. The pump 140 then evacuates a space between the valve 114 and the valve 134 until the space between the valves 114 and 134 reaches the vacuum pressure of the chamber of the beam system 110 and the interior region of the sample transfer capsule 130, whereafter the valves 114 and 134 can both open. The sample loading system 112 may then load the sample(s) 132 from the chamber of the beam system 110 to the interior region of the sample transfer capsule 130, for example or from the interior region of the sample transfer capsule 130 to the chamber of the beam system 110. In some examples, the space between the valves 114, 134 (which can be referred to as an airlock or airlock region in some examples) can be evacuated to match a vacuum pressure of the interior region of the capsule 130, the valve 134 can be opened, and then the two regions can be pumped to a selected vacuum pressure that can match a vacuum pressure of the beam system 110 before opening the valve 134.

Similarly, the sample loading system 122 of the second beam system 120 may include a valve 124 adjustable from an open state to a closed state to seal a chamber of the beam system 120 from atmosphere. To load and unload the sample(s) 132 between the sample transfer capsule 130 and the second beam system 120, the valves 124 and 134 are configured to open when the sample transfer capsule 130 is coupled to the beam system 120 and a space between the valves 124 and 134 is evacuated, via the pump 140 for example, to a vacuum pressure matching the pressure of the chamber of the second beam system 120 and the interior region of the sample transfer capsule 130. Alternatively or additionally, the space between the valves 124, 134 can be evacuated to match a vacuum pressure of the interior region of the sample transfer capsule 130 before adjusting a capsule pressure to match the beam system 120 or opening the valve 124. Example methods for loading and unloading samples between the sample transfer capsule 130 and a beam system such as the beam system 110 or the beam system 120 are described further herein with regard to FIGS. 8 and 9.

Thus, the sample transfer capsule 130 enables the transfer of multiple samples under vacuum pressure between a plurality of beam systems, including one or more dual-beam systems, one or more single-beam systems, one or more storage systems, and one or more sample handling systems. As discussed further herein, the sample transfer capsule 130 comprises a sample loading system interface configured to form a seal between the sample transfer capsule 130 and a sample loading system, such as the sample loading systems 112 or 122, when the sample loading system interface is in face-sharing contact with the sample loading system.

Figure 2:
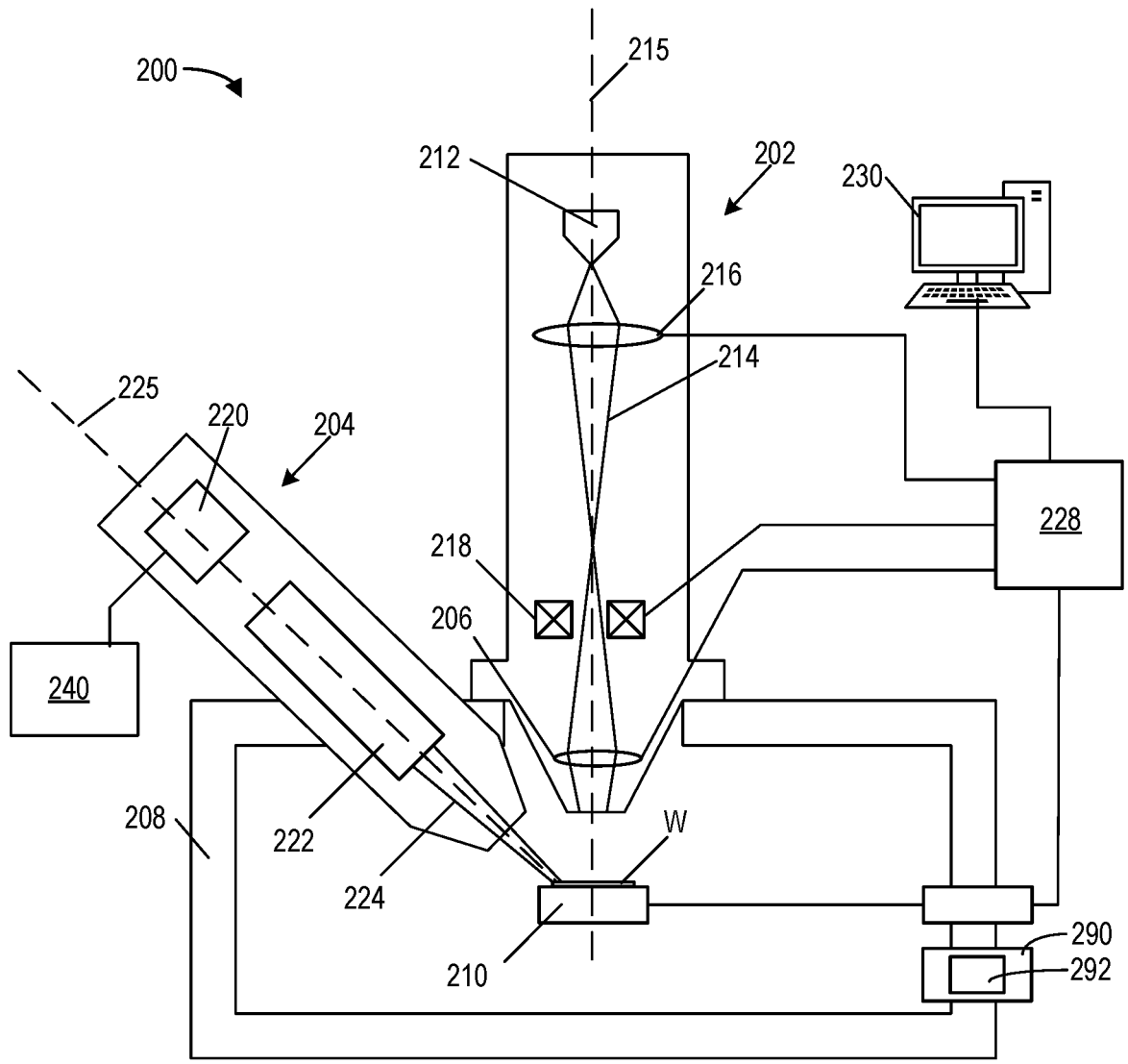
FIG. 2 shows a block diagram illustrating an example beam system, according to an example.

Referring to FIG. 2, in a representative example, a multi-beam system can be configured as a dual-beam system 200 comprising a scanning electron microscope (SEM) generally indicated at 202 and an ion beam column generally indicated at 204. The SEM 202 can comprise one or more charged particle beam (CPB) lenses such as a condenser lens 216 and an objective lens 206. In some examples, one or more CPB lenses can be magnetic lenses, and particularly, the objective lens 206 can be a magnetic objective lens. The ion beam column is arranged to provide a focused ion beam (FIB) to a workpiece W, and the SEM 202 is situated for production of an image of the workpiece W.

The SEM 202 and the ion beam column 204 can be mounted to a vacuum chamber 208 housing a movable positioning system 210 for holding the workpiece W. The vacuum chamber 208 can be evacuated using vacuum pumps (not shown). As discussed in further detail below, the positioning system 210 can be movable along the X-, Y-, and/or Z-axes as shown with respect to a coordinate system 250, wherein the Y-axis is perpendicular to the plane of the page.

In some examples, the SEM 202 can be arranged vertically above the workpiece W and can be used to image the workpiece W, and the ion beam column 204 can be arranged at an angle and can be used to machine and/or process the workpiece W. FIG. 2 shows an exemplary orientation of the SEM 202 and the ion beam column 204.

The SEM 202 can comprise an electron source 212 and can be configured to manipulate a "raw" radiation beam from the electron source 212 and perform upon it operations such as focusing, aberration mitigation, cropping (using an aperture), filtering, etc. The SEM 202 can produce a beam 214 of input charged particles (e.g., an electron beam) that propagates along a particle-optical axis 215. The SEM 202 can generally comprise one or more lenses (e.g., CPB lenses) such as the condenser lens 216 and the objective lens 206 to focus the beam 214 onto the workpiece W. In some examples, the SEM 202 can be provided with a deflection unit 218 that can be configured to steer the beam 215. For example, the beam 214 can be steered in a scanning motion (e.g., a raster or vector scan) across a sample being investigated or a workpiece to be processed.

The dual-beam system 200 can further comprise a computer processing apparatus and/or a controller 228 for controlling, among other things, the deflection unit 218, charged particle beam (CPB) lenses 206, 216, and detectors (not shown), and for displaying information gathered from the detectors on a display unit. In some cases, a control computer 230 is provided to establish various excitations, record imaging data, and generally control operation of both the SEM and the FIB.

Referring still to FIG. 2, the ion beam column 204 can comprise an ion source (e.g., a plasma source 220) and ion beam optics 222. In the illustrated example, the ion beam column 204 is a plasma focused ion beam (PFIB), however, in other examples, the ion beam column 204 can be a standard focused ion beam (FIB) having a liquid metal ion source (LMIS), or any other ion source compatible with a focused ion beam column. The ion beam column 204 can produce and/or direct the ion beam 224 along an ion-optical axis 225. As mentioned above, the ion column 204 can be used to perform imaging, processing and/or machining operations on the workpiece, such as incising, milling, etching, depositing, etc.

In examples wherein the ion beam is a PFIB, the ion source 220 can be fluidly coupled to a plurality of gases via a gas manifold 240 that includes gas sources coupled by respective valves to the ion source 220. During operation of the ion source 220, a gas can be introduced, where it becomes charged or ionized, thereby forming a plasma. Ions extracted from the plasma can then be accelerated through the ion beam column 204, becoming an ion beam. In other examples, the system 200 can comprise one or more lasers, or other types of milling or diagnostic tools.

As mentioned above, such multi-beam systems can comprise a positioning system (e.g., a stage) configured to hold and position the workpiece W. The positioning system can position/move a carrier element in multiple degrees of freedom, including linear movement (e.g., to choose a particular area for analysis on a workpiece) and/or angular or rotational movement (e.g., to achieve a selected angle of the workpiece relative to an instrument).

Further, as described hereinabove with regard to FIG. 1, the beam system 200 may include a sample loading system 290 configured to load samples from a sample transfer capsule to the vacuum chamber 208. The sample loading system 290 may include a robotic arm 292 or another device for moving samples between the sample transfer capsule and the vacuum chamber 208. The robotic arm 292 may be controlled, for example, via the controller 228 to transfer samples between sample transfer capsules and the vacuum chamber 208.

Figure 3:
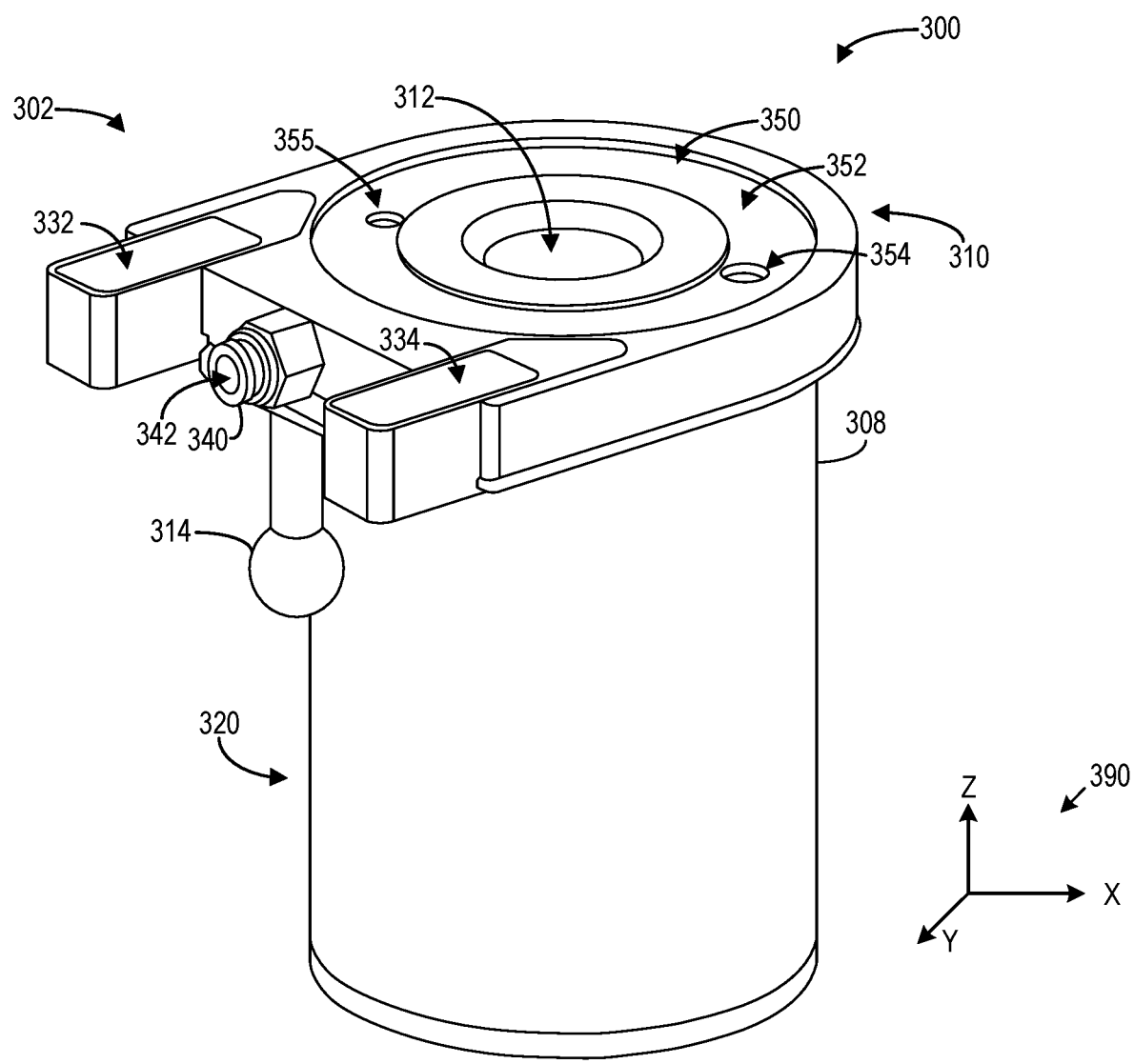
FIG. 3 shows a diagram illustrating a perspective view of an example capsule, according to an example.

FIG. 3 shows a diagram illustrating a perspective view 300 of an example sample transfer capsule 302, according to an example. The sample transfer capsule 302, also referred to herein as capsule 302, is configured to transport one or more samples while maintaining the one or more samples at a desired pressure and a desired temperature.

As depicted, the capsule 302 comprises an upper portion 310 and a lower portion 320 formed by a housing 308. The housing 308 may comprise one or more materials suitable for encapsulating samples as described herein, and it should be appreciated that the housing 308 may comprise a unitary housing (e.g., a single housing) or in some examples may comprise two or more housings (e.g., a housing for the upper portion 310 and a housing for the lower portion 320) fixedly coupled to each other to form the housing 308.

The lower portion 320 of the capsule 302 includes an interior region (not shown) for storing one or more samples. The interior region is accessible via a sample port 312 in the upper portion 310 of the capsule 302. Samples may therefore be loaded to and unloaded from the capsule 302 via the sample port 312. As depicted by the example coordinate system 390, the sample transfer capsule 302 is oriented such that the top of the capsule 302 (i.e., the upper portion 310) is above the bottom of the capsule 302 (i.e., the lower portion 320). In other words, the upper portion 310 is at a greater z position than the lower portion 320, with regard to the coordinate system 390 as depicted. As the top of the upper portion 310 couples to the sample loading system of a charged particle system for sample transfer, samples are therefore loaded and unloaded from the capsule 302 via the sample port 312 by moving the samples in the vertical direction (i.e., the z direction) through the sample port 312 in the depicted orientation of the capsule 302 relative to the coordinate system 390. The capsule 302 may be maintained in the depicted upright position during transport of the capsule 302 between systems, such as between different charged particle beam systems.

The upper portion 310 further includes a valve 314 that is adjustable from a closed position to an open position. When the valve 314 is in the closed position, the interior region of the lower portion 320 is sealed such that the interior region is inaccessible via the sample port 312. When the valve 314 is in the open position, the interior region is accessible via the sample port 312. The valve 314 may comprise, for example, a gate valve such that the valve 314 provides a barrier to the interior region in the closed position and removes the barrier in the open position.

The lower portion 320 of the capsule 302 further includes a cryogen reservoir (not shown) for storing cryogenic liquid such as liquid nitrogen. As depicted, the upper portion 310 of the capsule 302 includes cryogen ports 332 and 334 through which cryogenic liquid may be poured to fill the cryogen reservoir. In contrast with the sample port 312 which may be closed via the valve 314 to seal the interior region of the capsule 302 from atmosphere, the capsule 302 does not include valves for closing the cryogen ports 332 and 334, thereby allowing pressure relief for the cryogen reservoir via the cryogen ports 332 and 334. It should be appreciated, however, that in some examples the capsule 302 may include a valve to secure the cryogenic liquid within the cryogen reservoir by at least partially sealing the cryogen ports 332 and 334, and in such examples the capsule 302 may include at least one pressure relief valve configured to relieve pressure buildup within the cryogen reservoir. It should be appreciated that the capsule 302 should be maintained the depicted vertical direction (i.e., upright so that the capsule 302 is vertically aligned with the z direction) during transport while cryogenic liquid is stored in the cryogen reservoir, as otherwise orienting the capsule 302 (e.g., in the horizontal directions x and/or y) may result in the cryogenic liquid spilling from the cryogen ports 332 and 334. Further, in some examples the cryogen reservoir may be configured to retain cryogenic temperatures after the cryogenic liquid is removed. For example, the cryogen reservoir may comprise a material with a high thermal mass such that the cryogen reservoir is cooled to cryogenic temperatures when filled with cryogenic liquid such as liquid nitrogen, and then maintains the cryogenic temperatures after the cryogenic liquid is removed from the cryogenic reservoir. In this way, the cryogen reservoir may be charged to cryogenic temperatures and thus cool the compartment of the lower portion 320 storing the one or more samples during sample transfer as described further herein without storing cryogenic liquid during the sample transfer.

The upper portion 310 of the capsule 302 further includes a hose coupling 340 with a port 342 to allow the connection of a first end of a hose (not shown) to the capsule 302, where the second end of the hose may be coupled to a pump, such as the pump 140. In this way, gases in the interior region of the capsule 302 may be evacuated or pumped out from the interior region via port 342 and through the hose. As depicted, the hose coupling 340 may include threads or a lip adapted to couple to a corresponding hose coupling fixed to an end of the hose configured with corresponding threads such that the hose coupling 340 forms a seal with the corresponding hose coupling of the hose when the hose coupling 340 is inserted into the corresponding hose coupling. Further, the port 342 allows fluidic communication with the hose and the interior region of the capsule 302 when the hose coupling 340 is attached to the corresponding hose coupling of the hose.

The upper portion 310 may further include a sample loading system interface 350 comprising a region of a top exterior surface of the upper portion 310, the sample loading system interface 350 structurally adapted to enable secure coupling with a loading system, such as the sample loading system 112 and the sample loading system 122, when the sample loading system interface 350 is in face-sharing contact with a component of such a loading system. As an illustrative and non-limiting example, the sample loading system interface 350 may include a recessed portion 352 encircling the sample port 312 and thereby forming a lip concentric with the sample port 312, such that a protruding portion of the component of the sample system may correspond to the recessed portion 352 when the sample loading system interface 350 is in face-sharing contact with such component, thereby aligning the sample port 312 with a corresponding port of the component. As depicted, the recessed portion 352 of the sample loading system interface 350 may further include additional recessed portions or holes 354 and 355 adapted to receive corresponding protrusions of the component of the loading system, thereby further ensuring a desired alignment of the sample port 312 with the component of the loading system. In this way, the sample loading system interface 350 may enable an interlocking of the capsule 302 with such a loading system in a desired orientation that allows samples to be loaded and unloaded from the interior region of the capsule 302 via the sample port 312.

Figure 4:
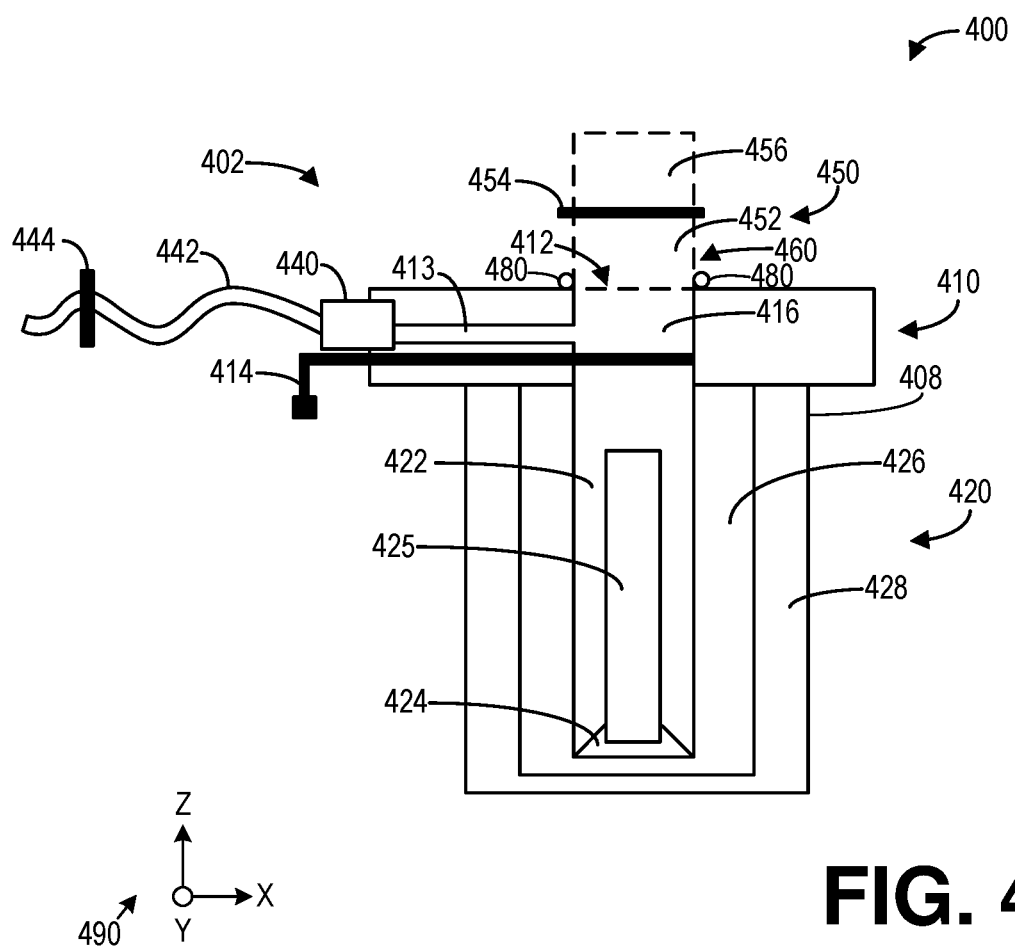
FIG. 4 shows a block diagram illustrating a cross-sectional view of an example capsule, according to an example.

As an illustrative and non-limiting example of the interior structure of the capsule 302, FIG. 4 shows a block diagram illustrating a cross-sectional view 400 of an example capsule 402, which may comprise the capsule 302. The capsule 402 includes an upper portion 410 and a lower portion 420 formed by a housing 408, where the upper portion 410 is positioned above the lower portion 420 (i.e., the upper portion 410 is at a greater vertical or z position than the lower portion 420), and where the capsule 402 is generally maintained in an upright position relative to the z axis depicted by the example coordinate system 490. The lower portion 420 of the capsule 402 includes an interior region 422 for storing a sample cartridge 425, wherein the sample cartridge 425 may be loaded with one or more samples. The interior region or compartment 422 may include a sample holder 424 adapted to secure the sample cartridge 425 within the interior region 422. As depicted, the sample holder 424 is positioned at a bottom of the interior region 422 and thus near a bottom of the lower portion 420, where the term "bottom" is defined relative to a "top" along a vertical axis, such as the z axis, when the capsule 402 is in an upright, vertical orientation, so that the bottom is below (i.e., at a lower vertical position) the top. Here, the term "bottom" refers to a lowest portion of the lower portion 420 along the z axis when the capsule 402 is oriented in an upright position (i.e., aligned with the vertical z axis), in contrast with a "top" of the lower portion 420 corresponding to a highest portion of the lower portion 420, where the top of the lower portion 420 is fixedly attached to the bottom of the upper portion 410 as depicted. The one or more samples may be arranged on a TEM sample holder, also referred to as a TEM grid, for example, with one lamella per cell of the TEM grid, and the cartridge may store one or more such TEM grids. The sample cartridge 425 may comprise a cassette, for example, comprising a plurality of slots, each slot configured to hold a sample or a TEM grid. The sample loading system of the beam system may be configured to load the cassette, and further to load individual TEM grids to and from the cassette for processing and transfer. In this way, the sample cartridge 425 may transport a plurality of TEM grids. In another example, the sample cartridge 425 comprises a TEM grid.

The lower portion 420 further includes a cryogen reservoir 426 that may be filled with cryogenic liquid. In examples wherein the capsule 402 is cylindrical, for example as depicted by the capsule 302 in FIG. 3, the interior region 422 and the cryogen reservoir 426 may be cylindrical, with the interior region 422 and the cryogen reservoir 426 concentrically located at the center of the lower portion 420 of the capsule 402, as depicted. In particular, the cryogen reservoir 426 may surround the interior region 422, with the wall of the interior region 422 separating the interior region 422 from the cryogen reservoir adapted to allow thermodynamic conduction, thereby allowing the interior region 422 to reach thermodynamic equilibrium with the cryogen reservoir 426. In this way, the interior region 422 may be cooled to cryogenic temperatures without directly exposing the sample cartridge 425 and thus the samples stored therein to cryogenic liquid. In general, the cryogen reservoir 426 may surround or be coaxial with the interior region 422 regardless of the shape of the interior region 422 and the cryogen reservoir 426. The lower portion 420 of the capsule 402 further includes vacuum insulation 428 surrounding the cryogenic reservoir 426 and within the housing 408 as depicted, thus insulating the cryogenic reservoir 426 from outside of the capsule 402, and thereby enabling handling of the capsule 402.

To load and unload samples, the capsule 402 may couple to a loading system, such as the sample loading system 112 of a beam system 110. Specifically, as depicted, the capsule 402 couples to the loading system via a loading system coupling 450. The loading system coupling 450 may include a valve 454 configured to selectively seal, when the valve 454 is in a closed state, an inner pathway 456 of the loading system coupling 450 from an outer pathway 452 of the loading system. When the valve 454 is in an open state, the outer pathway 452 and the inner pathway 456 of the loading system coupling 450 are in open communication. In this way, a robotic arm or another mechanism of the loading system configured to grasp and move the sample cartridge 425 may pass through pathways 452 and 456, through the sample port 412, and to the interior region 422 to grasp or ungrasp the sample cartridge 425 for unloading or loading the sample cartridge 425, respectively. Thus, as depicted, the upper portion 410 and the lower portion 420 are configured to receive a loading arm or robotic arm of the sample loading system of the charged particle system, wherein the loading arm is configured to move the cartridge 425, via the sample port 412, between the compartment 422 and a vacuum chamber of the charged particle system to load or unload the cartridge 425 from the compartment 422. For example, the loading arm extends through the loading system coupling 450, through the outer capsule region 416 in the upper portion 410, and into the compartment 422 of the lower portion 420 to load or unload the cartridge 425 to or from the compartment 422.

The capsule valve 414 is adjustable from an open position to a closed position. In the closed position, as depicted, the capsule valve 414 separates the interior region 422 of the capsule 402 from an outer capsule region 416 in the upper portion 410 of the capsule 402. In addition to enabling passage through the upper portion 410 from the sample port 412 to the interior region 422, the outer capsule region 416 is coupled to the hose coupling 440 via a channel 413 through the upper portion 410. The hose coupling 440 may be coupled to a first end of a hose 442, wherein a second end of the hose 442 is coupled to a pump (not shown). When the capsule 402 is coupled to the sample loading system via the load coupling 450, an airlock 460 is formed comprising at least the outer capsule region 416, though it should be appreciated that the airlock 460 may further include the outer pathway 452 of the load coupling 450 as depicted. The airlock 460 can therefore form a differentially pumped intermediary region between the pathway 456 and interior region 422 that can allow contamination-free transfer of samples under vacuum between systems under vacuum. The load coupling 450 may include a gasket such as an O-ring 480 to provide a seal between the load coupling 450 and the upper portion 410 of the capsule 402 when the load coupling 450 and upper portion 410 are connected together.

The hose 442 may include a hose valve 444 that when open allows pumping of the capsule 402 via the pump, and when closed prevents pumping of the capsule 402 via the pump. For example, when a pump is coupled to the capsule 402 via the hose 442, the airlock 460 comprising the outer capsule region 416, the channel 413, and the outer pathway 452 may be evacuated via pumping while the capsule valve 414 is closed and the loading system valve 454 is closed by opening the hose valve 444. Further, when the capsule valve 414 is open and the loading system valve 454 is closed, the interior region 422, the outer capsule region 416, and the channel 413 may be evacuated via pumping by opening the hose valve 444.

Further still, if a lid (not shown) is used to cover the sample port 412 when the capsule 402 is not coupled to the loading system coupling 450, the interior region 422 and the outer capsule region 416 including the channel 413 may be evacuated via pumping by opening the hose valve 444 while the capsule valve 414 is open. When the interior region 422 is thus evacuated to a target vacuum pressure, the capsule valve 414 may be closed to seal the interior region 422 at the vacuum pressure. The hose 442 may then be decoupled from the capsule 402, thereby venting the outer capsule region 416 to atmosphere, and the capsule 402 may be transported while the interior region 422 is held at the vacuum pressure. When the capsule 402 is coupled to a loading system of a beam system while the interior region 422 is sealed at a vacuum pressure, the outer capsule region 416 may be pumped to the vacuum pressure via the hose 442 prior to opening the capsule valve 414 and the loading system valve 454. A pressure of the interior region 422 can also be brought to match a vacuum pressure of the loading system by pumping the outer capsule region 416 to the pressure of the interior region 422, opening the valve 414, and pumping the combined regions 416, 422 to the matching pressure of the loading system. Example methods for controlling the valves during loading and unloading of samples are described further herein with regard to FIGS. 8 and 9.

As depicted, the housing 408 envelopes the compartment or interior region 422 and the reservoir 426. The housing 408 further forms the sample port 412 in an exterior surface of the housing, wherein the compartment or interior region 422 is accessible through the sample port 412 when the valve 414 is in an open position. The housing 408 further forms one or more cryogen ports (not shown) in the upper portion 410 for providing fluidic communication to the reservoir 426, such that cryogenic liquid may be poured into the reservoir 426 via the cryogen port(s).

Figure 5:
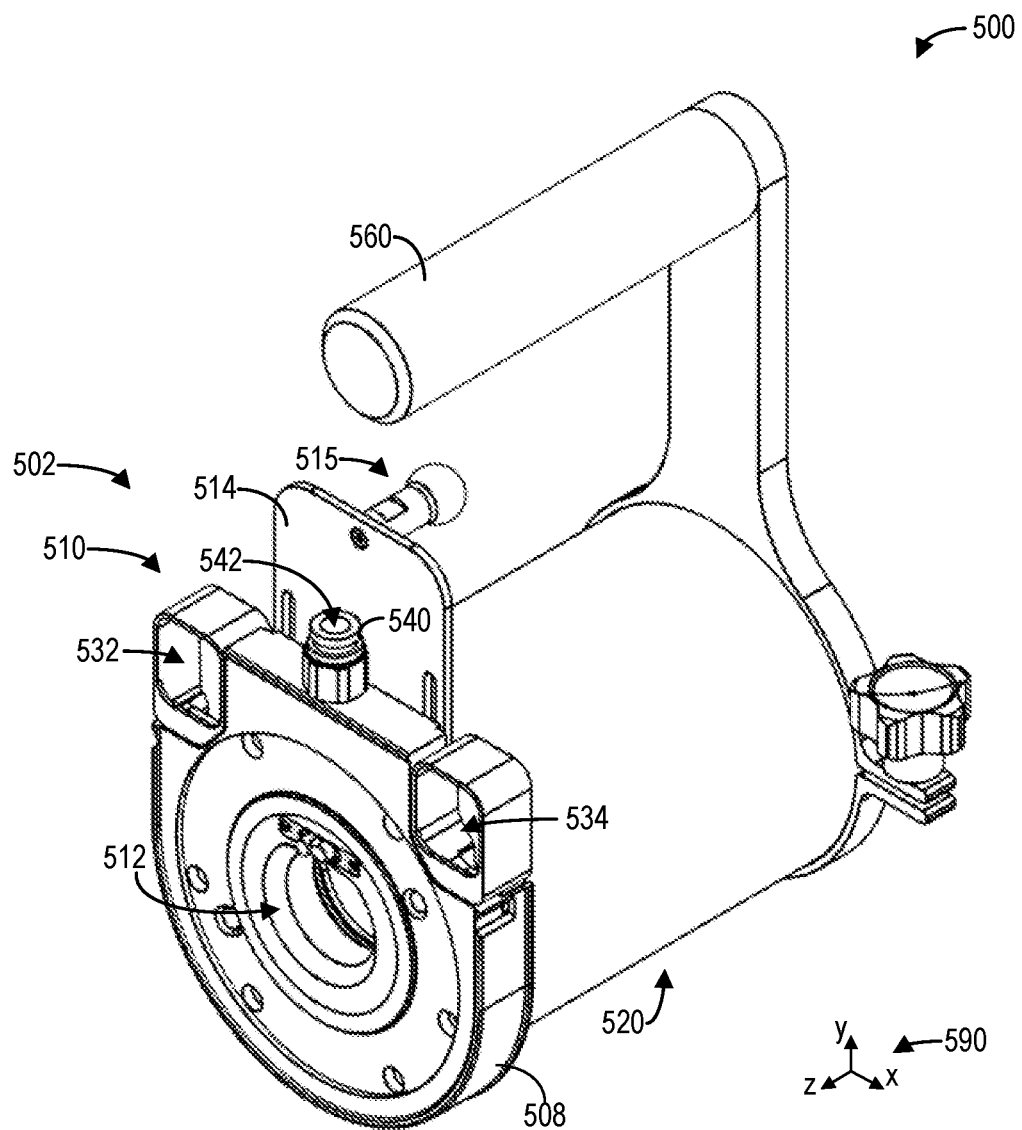
FIG. 5 shows a diagram illustrating a perspective view of an example capsule, according to an example.
Figure 6:
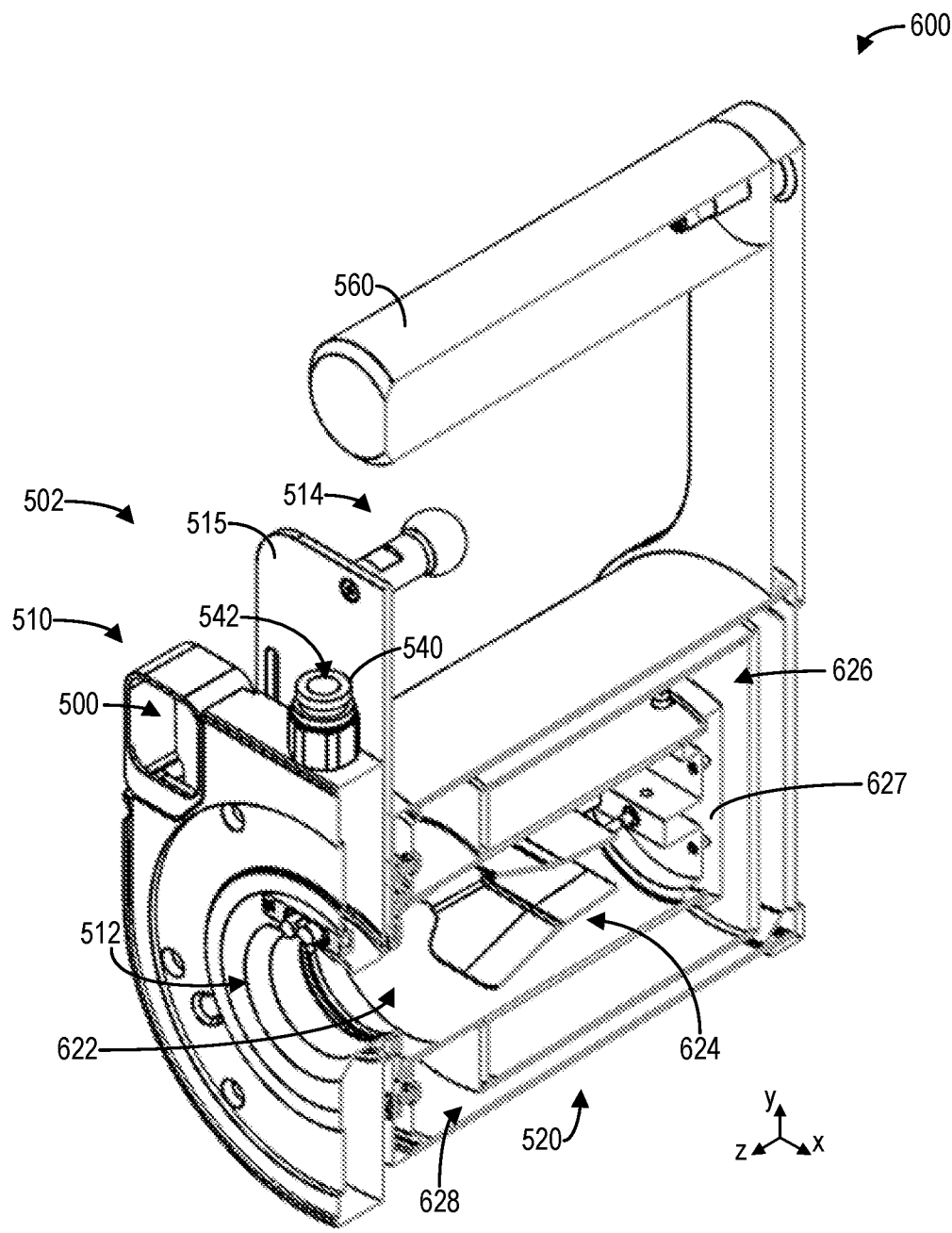
FIG. 6 shows a diagram illustrating a perspective cross-sectional view of the example capsule of FIG. 5, according to an example.
Figure 7:
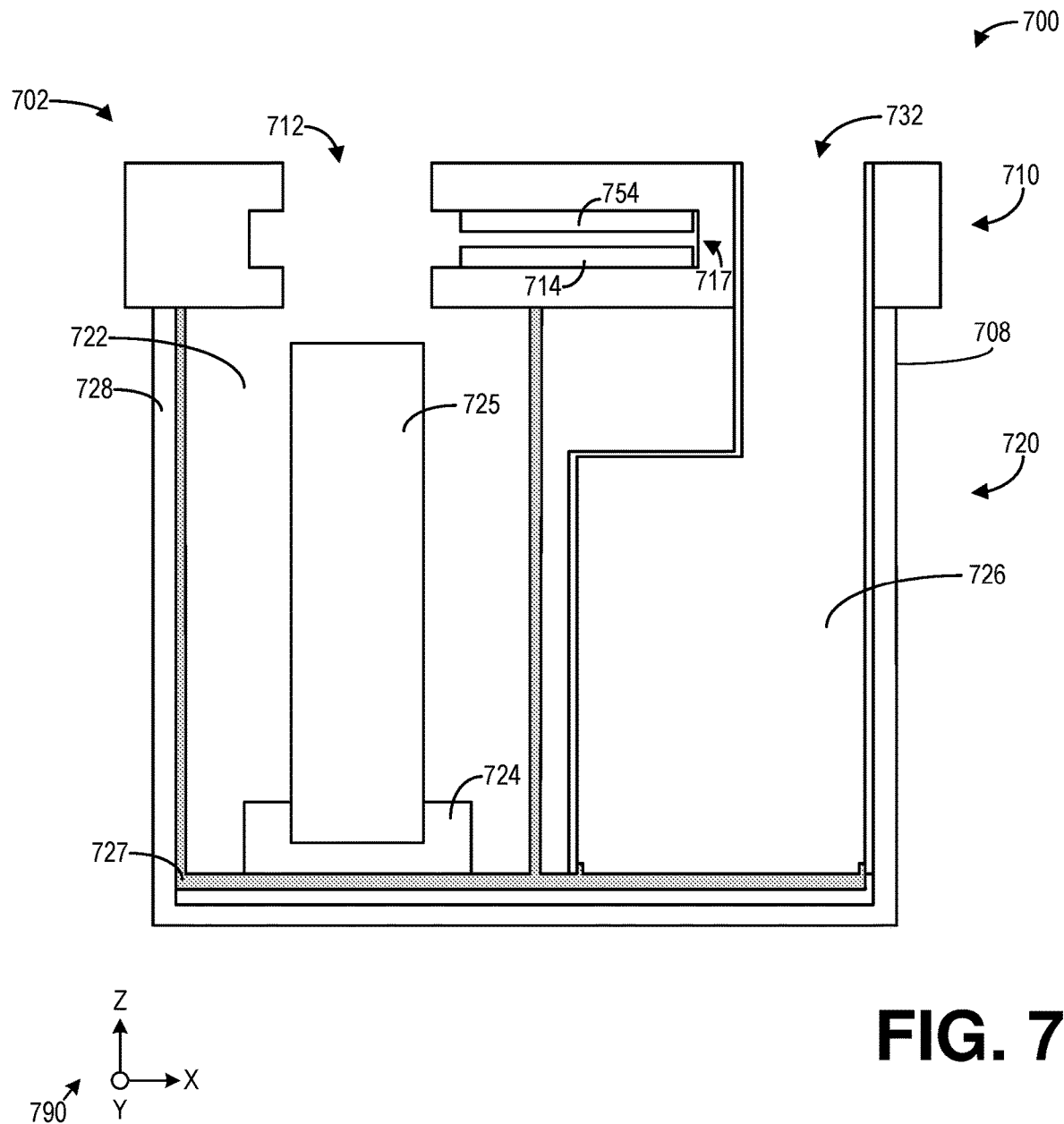
FIG. 7 shows a block diagram illustrating a cross-sectional view of another example capsule, according to an example.

As another example of a sample transfer capsule, FIGS. 5 and 6 show different views of an example capsule 502. In particular, FIG. 5 shows a diagram illustrating a perspective view 500 of the example capsule 502, while FIG. 6 shows a perspective cross-sectional view 600 of the example capsule 502. The capsule 502 may comprise the sample transfer capsule 130, for example, and may include the features of the capsules 302 and 402 described hereinabove. For example, the capsule 502 includes an upper portion 510 and a lower portion 520 formed by a housing 508, where the upper portion 510 is positioned above the lower portion 520 such that the upper portion 510 is at a greater vertical position than the lower portion 520 along the z axis as depicted by the example coordinate system 590, where the z axis defines a vertical direction relative to a horizontal plane defined by the x and y axes. In addition, the capsule 502 further includes a handle 560 extending from a base of the capsule 502, as depicted, which allows the capsule 502 to be carried while maintaining the capsule 502 in an upright position (i.e., relative to the z axis of the coordinate system 590) without directly handling the lower portion 520 or the upper portion 510 of the capsule 502.

The capsule 502 further includes a capsule valve 514 with a valve handle 515 for adjusting the capsule valve 514 from an open position, for example as depicted wherein the capsule valve 514 does not seal an interior region 622 of the capsule 502, to a closed position wherein the capsule valve 514 seals the interior region 622. The upper portion 510 of the capsule 502 includes a sample port 512 to provide access to the interior region 622 of the capsule 502 when the capsule valve 514 is opened. The upper portion 510 of the capsule 502 further includes a hose coupling 540 for coupling a hose (not depicted) to the capsule 502, wherein the capsule 502 may be evacuated through the port 542. The upper portion 510 of the capsule 502 further includes cryogen ports 532 and 534 through which cryogenic liquid may be poured to fill the cryogen reservoir 626 of the capsule 502.

The lower portion 520 includes the interior region 622 of the capsule 502, wherein a sample holder 624 is positioned for holding a sample or sample cartridge. The interior region 622 may comprise a cylindrical space along the center of the capsule 502, for example as depicted, though it should be appreciated that the interior region 622 may be configured in non-cylindrical shapes in other examples. The lower portion 520 further includes the cryogen reservoir 626 for storing cryogenic liquid. As depicted, the cryogen reservoir 626 may comprise a cylindrical space concentric or coaxial with and at least partially surrounding the interior region 622. Heat transfer between the cryogen reservoir 626 and the interior region 622 may occur through the face-sharing boundaries of the cryogen reservoir 626 and the interior region 622, for example, and/or through the base plate 627 for the sample holder 624. The lower portion 520 may further include vacuum insulation 628 between the cryogen reservoir 626 and the exterior of the lower portion 520, as depicted, to insulate the cryogen reservoir 626 and the interior region 622 within the lower portion 520.

Although the capsules described hereinabove indicate that the cryogen reservoir of a sample transfer capsule may be concentric or coaxial with and at least partially surround or envelope the interior region of the capsule wherein samples are stored, it should be appreciated that in some examples the cryogen reservoir may not be coaxial with the interior region. As an illustrative example, FIG. 7 shows a block diagram illustrating a cross-sectional view 700 of another example capsule 702, according to an example. As depicted, the capsule 702 includes an upper portion 710 and a lower portion 720 formed by a housing 708, where the upper portion 710 is positioned above the lower portion 720 such that the upper portion 710 is at a greater vertical position than the lower portion 720 along the z axis as depicted by the example coordinate system 790, where the z axis defines a vertical direction relative to a horizontal plane defined by the x and y axes. Samples may be loaded or unloaded to the capsule 702 via a sample port 712 in the upper portion 710, and the samples may be stored in an interior region 722 of the lower portion 720 of the capsule 702. As depicted, a sample cartridge 725 may fit through the sample port 712 and may be secured in a sample holder 724 within the interior region 722.

Further, the upper portion 710 includes a cryogen port 732 through which cryogenic liquid may be poured to fill a cryogen reservoir 726 of the lower portion 720. As depicted, the cryogen reservoir 726 is adjacent to the interior region 722 but does not envelop the interior region 722. Heat transfer may occur via the base plate 727 extending from a base of the cryogen reservoir 726 to the interior region 722. For example, heat transfer may occur between the interior region 722 and the cryogen reservoir 726 via the base plate 727 through conduction, such that the interior region 722 may approach thermal equilibrium with the cryogen reservoir 726. In this way, when the cryogen reservoir 726 is filled with a cryogenic liquid such as liquid nitrogen, the temperature of the interior region 722 may approach or reach the temperature of the cryogenic liquid. The base plate 727 may extend upwards from the base of the interior region 722 to envelop the interior region, as depicted, thereby providing additional thermal conduction. The lower portion 720 further includes vacuum insulation 728 around the interior region 722 and the cryogen reservoir 726 to thermally isolate the interior region 722 and the cryogen reservoir 726.

Further, as depicted, the upper portion 710 of the capsule 702 includes an inner capsule valve 714 and an outer capsule valve 754. Both valves 714 and 754 are configured to adjust between open positions, as depicted for both valves 714 and 754 wherein the valves 714 and 754 do not obstruct the passage between the sample port 712 and the interior region 722, and closed positions wherein the valves 714 and 754 obstruct the passage between the sample port 712 and the interior region 722. The valves 714 and 754 may be adjusted between open and closed positions via one or more actuators, in contrast for example with the manual adjustment of the capsule valve 514 described hereinabove. Further, the valves 714 and 754 may be independently controlled, for example such that the inner capsule valve 714 may be adjusted to a closed position to seal the interior region 722 while the outer capsule valve 754 may be maintained in an open position. The outer capsule valve 754 may be controlled in a similar way to the control of the loading system valve 454 described hereinabove with regard to FIG. 4, for example when docking the capsule 702 to a loading system, wherein the space between the valves 714 and 754 may be evacuated to vacuum pressure while both valves 714 and 754 are closed, with additional vacuum pumping after opening the valve 754 to evacuate the outer pathway of a loading system coupling, such as the outer pathway 452 of the loading system coupling 450. Including more than one valve in this way may enable better vacuum performance and potential active pumping during transfer, thereby enabling a longer transfer time. Although two valves are shown, it should be appreciated that in some examples, the capsule 702 may include a single valve 714 configured to seal the interior region 722, similar to the capsule 402 described hereinabove.

Furthermore, in contrast with the capsule valve 514 that extends outside of the capsule 502 when in an open position, the valves 714 and 754 may remain within the upper portion 710 of the capsule 702 when in an open position, for example by sliding into a cavity 717 of the upper portion 710.

Thus, various sample transfer capsules are provided for transporting samples to and from a beam system, wherein the sample transfer capsules maintain the samples at a desired pressure and a desired temperature during transport. It should be appreciated that the example capsules described hereinabove are illustrative and non-limiting, and that a sample transfer capsule in accordance with the present disclosure may include different combinations of the components described hereinabove. For example, a sample transfer capsule may include a cryogen reservoir that is non-coaxial to an interior region, such as the capsule 702, with a capsule valve that is manually adjustable, such as the valve 414. As another example, a sample transfer capsule may include a cryogen reservoir that is coaxial with an interior region, such as the capsule 402, with a capsule valve that is automatically adjustable via an actuator, such as the valve 714.

The sample transfer capsules provided herein enable the transfer of samples between beam systems, such as between a TEM and a SEM, while maintaining the samples at a desired pressure and a desired temperature. The beam systems include automatic loading systems configured to automatically load and unload samples from the sample transfer capsules. As illustrative and non-limiting examples, FIGS. 8 and 9 illustrate example methods for loading and unloading samples between such capsules and beam systems.

Figure 8:
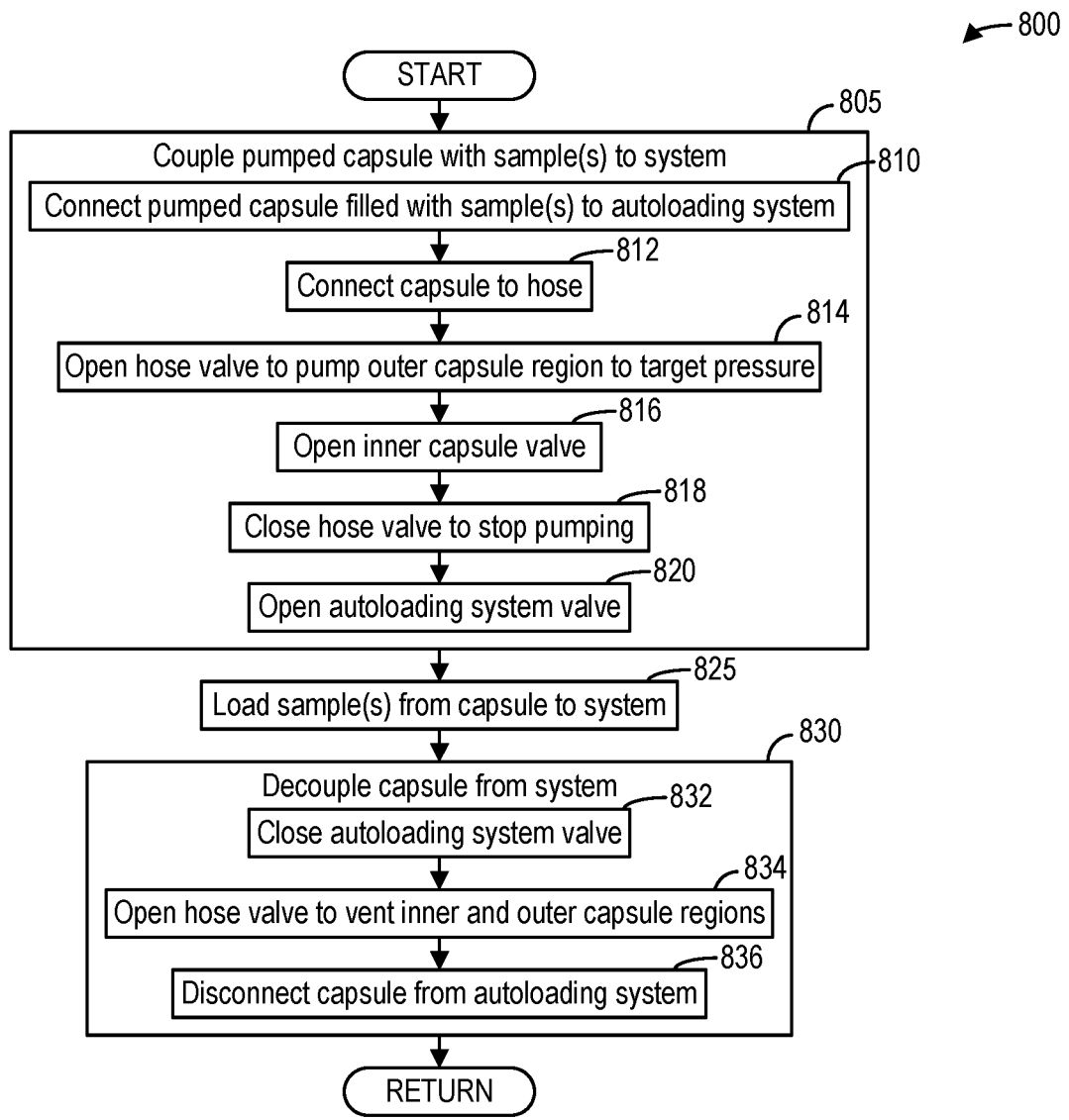
FIG. 8 shows a high-level flow chart illustrating an example method for loading samples from a capsule to a beam system, according to an example.
Figure 9:
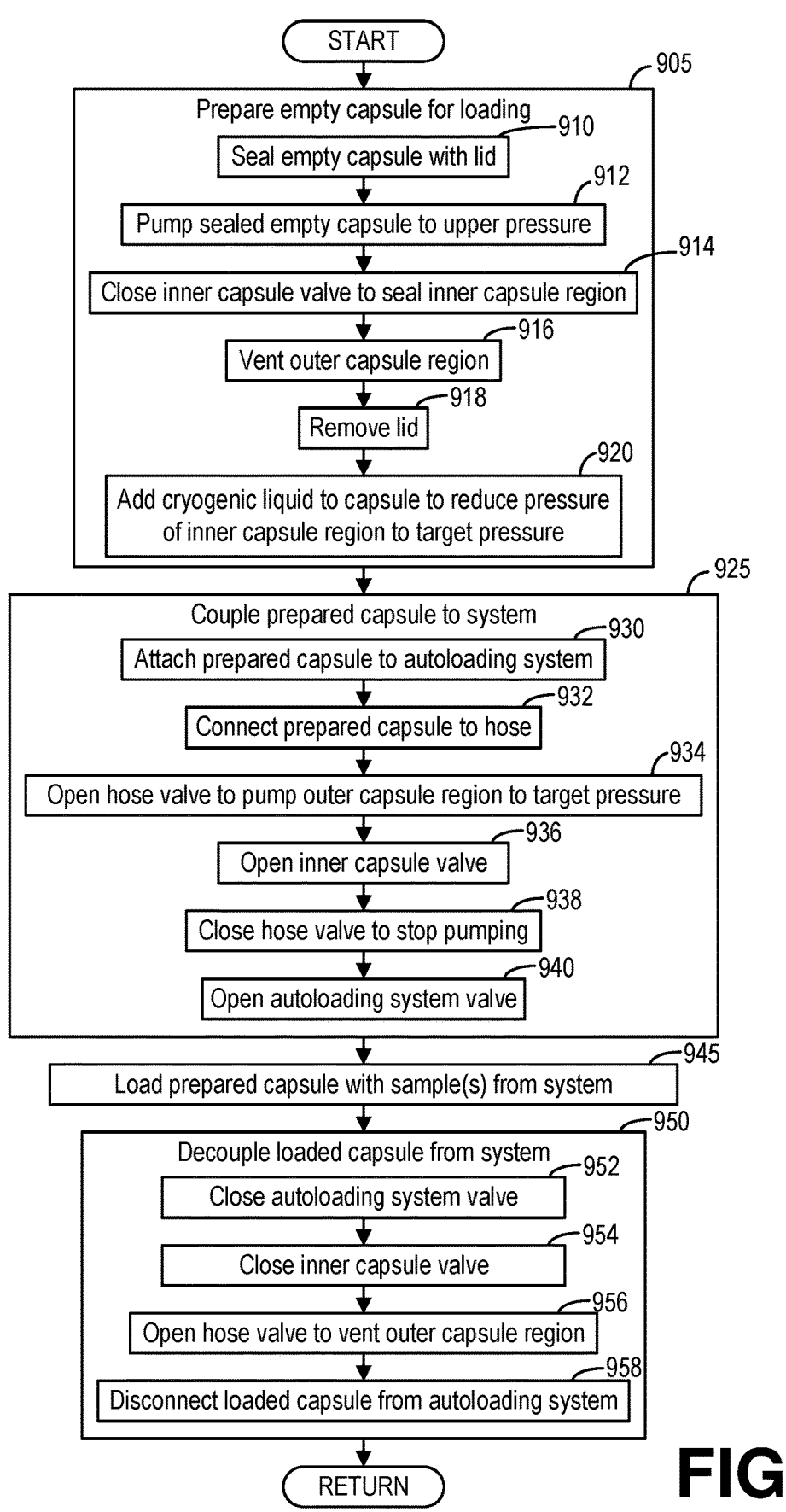
FIG. 9 shows a high-level flow chart illustrating an example method for unloading samples from a beam system to a capsule, according to an example.

In particular, FIG. 8 shows a high-level flow chart illustrating an example method 800 for loading samples from a capsule to a beam system, according to an example. In particular, method 800 relates to docking a sample transfer capsule to a beam system for loading samples from the sample transfer capsule to the beam system. Method 800 is described with regard to the systems and components of FIGS. 1-7, though it should be appreciated that method 800 may be implemented with other systems and components without departing from the scope of the present disclosure. For example, the capsule may comprise a sample transfer capsule such as the sample transfer capsules described hereinabove with regard to FIGS. 3-7, and the beam system may comprise the first beam system 110 or the second beam system 120 as described hereinabove with regard to FIG. 1.

Method 800 begins at 805. At 805, method 800 couples a pumped capsule with one or more sample(s) to a beam system. For example, the capsule may be loaded with one or more samples arranged in a sample cartridge (such as a cassette), and the one or more samples may be stored in an interior region of the capsule pumped to a target vacuum pressure. A cryogen reservoir of the capsule may also be loaded with cryogenic liquid to maintain the one or more samples at a target temperature.

To couple the pumped capsule with the sample(s) to the beam system, method 800 may, at 810, connect the pumped capsule filled with the sample(s) to the automatic loading (autoloading) system of the beam system. Connecting the pumped capsule to the autoloading system may comprise, for example, bringing a top exterior surface of an upper portion of the capsule, such as the sample loading system interface 350 of the capsule 302, into face-sharing contact with a respective component of the autoloading system. The top exterior surface of the capsule and the respective component of the autoloading system may be structurally adapted to form a seal when pressed together in face-sharing contact, as described hereinabove with regard to FIG. 3.

Further, at 812, method 800 may connect the pumped capsule to a hose. For example, a first end of a hose, such as the hose 442, may be connected to a hose coupling of the capsule, such as the hose coupling 340 of the capsule 302. The second end of the hose may be coupled to a pump, such as the pump 140. The hose may be manually connected to the capsule by an operator, for example, or alternatively may be automatically connected to the capsule.

At 814, method 800 may open a hose valve of the hose to pump an outer capsule region of the capsule to a target pressure. For example, connecting the capsule and the autoloading system forms an airlock between the capsule and the autoloading system comprising the outer capsule region of the capsule. Opening the hose valve thus allows the pump to reduce the pressure of the outer capsule region from atmospheric pressure, for example, to a target pressure corresponding to the vacuum pressure of the interior region of the capsule or to another pressure. As an illustrative and non-limiting example, the interior region of the capsule storing the samples may be held at a vacuum pressure of 100 Pa, and so the outer capsule region may be pumped until the pressure of the outer capsule region reaches 100 Pa. It should be appreciated that the target pressure may comprise a vacuum pressure in the low vacuum range (e.g., 3,000 Pa to 100,000 Pa), in the medium vacuum range (e.g., 0.1 Pa to 3,000 Pa), or even in the high vacuum range or ultra-high vacuum range, depending on the type of sample being transferred via the capsule. The pressure may be measured using a gauge, as an illustrative and non-limiting example, positioned at the hose or the pump, though it should be appreciated that pressure measurements may be acquired within the capsule in some examples. Additionally, in some examples the capsule may further comprise an exterior valve, such as the valve 754 of the capsule 702. In such examples, method 800 may open the exterior valve of the capsule prior to or while pumping the airlock.

At 816, after the outer capsule region reaches the target pressure, method 800 may then open the inner capsule valve to unseal the interior region of the capsule, and then at 818, method 800 closes the hose valve to stop pumping. The valves may be manually or automatically opened. Continuing at 820, method 800 may open the autoloading system valve, thereby enabling passage from the autoloading system to the interior region of the capsule. The autoloading system valve may comprise a valve of the autoloading system, such as the valve 454 for example. Thus, by selectively controlling valves in a particular sequence, the pressure within the region between the beam system and the interior region of the capsule may be equalized when the capsule is docked to the beam system, thereby allowing the transfer of samples from the interior region of the capsule to the beam system at a desired vacuum pressure. In this way, changes in pressure that may produce artifacts in the samples may be avoided during sample transfer. In general, after equalizing the pressure in the airlock and the interior region, method 900 opens a first valve and then a second valve, the first valve and the second valve respectively comprising one of a capsule valve sealing the sample within a compartment of the transfer capsule or a loading system valve sealing the loading system from the airlock. For example, method 900 may first open the capsule valve and the open the autoloading system valve, as described hereinabove, or in other examples method 900 may first open the autoloading system valve and then the capsule valve.

After coupling the pumped capsule with the samples to the beam system at 805, method 800 continues to 825. At 825, method 800 loads the one or more sample(s) from the capsule to the system. For example, the autoloading system may automatically retrieve the one or more samples from the capsule via a robotic arm that extends through the passageway between the autoloading system to the interior region of the capsule, grasps the cartridge holding the one or more samples, and retracts back into the autoloading system with the cartridge. The arm may then position the cartridge and/or the one or more samples within the beam system for imaging. For example, the arm may remove the one or more samples from the cartridge and position the one or more samples within a beam path of the beam system.

At 830, method 800 decouples the capsule from the system. To decouple the capsule from the beam system, method 800 may first close the autoloading system valve at 832. At 834, method 800 may then open the hose valve to vent the inner and outer capsule regions to atmosphere. Method 800 then disconnects the capsule from the autoloading system at 836. The capsule is thus decoupled from the beam system. Method 800 then returns.

FIG. 9 shows a high-level flow chart illustrating an example method for unloading samples from a beam system to a capsule, according to an example. In particular, method 900 relates to docking a sample transfer capsule to a beam system for loading samples from the beam system to the sample transfer capsule. Method 900 is described with regard to the systems and components of FIGS. 1-7, though it should be appreciated that method 900 may be implemented with other systems and components without departing from the scope of the present disclosure. For example, the capsule may comprise a sample transfer capsule such as the sample transfer capsules described hereinabove with regard to FIGS. 3-7, and the beam system may comprise the first beam system 110 or the second beam system 120 as described hereinabove with regard to FIG. 1.

Method 900 begins at 905. At 905, method 900 prepares an empty capsule for loading with samples. To prepare the empty capsule for loading, method 900 may first, at 910, seal the empty capsule with a lid. For example, the lid may cover a sample port of the capsule, such as the sample port 312. To that end, the lid may couple to the upper portion of the capsule to securely cover the sample port and form a seal. In one example, an exterior valve such as the valve 754 of the capsule 702 may comprise a lid of the capsule, and so method 900 may close the exterior valve of the capsule in such examples. Thereafter, at 912, method 900 may pump the sealed empty capsule to an upper pressure. For example, a pump such as the pump 140 may be coupled to the capsule, for example via a hose coupling 340, and the pump may then be operated to evacuate the capsule. A capsule valve such as the capsule valve 314 may be open while pumping the capsule in order to evacuate the interior region of the capsule to the upper pressure. The upper pressure may comprise a vacuum pressure higher than the target vacuum pressure. For example, the upper pressure may be selected according to the target vacuum pressure, the target temperature, and the volume of the interior region of the capsule such that the pressure of the interior region reduces from the upper pressure to the target vacuum pressure when the interior region is cooled to the target temperature. At 914, once the interior region of the capsule reaches the upper pressure, method 800 may close the inner capsule valve, such as the valve 314, to seal the inner capsule region or interior region of the capsule.

Method 900 may then vent the outer capsule region at 916, for example by removing the hose from the hose coupling. At 918, method 900 may remove the lid covering the sample port. At 920, method 900 may add cryogenic liquid to the cryogen reservoir of the capsule to reduce the temperature of the interior region to the target temperature. As the temperature of the interior region decreases to the target temperature, the pressure of the interior region or inner capsule region reduces from the upper pressure to the target pressure. As an illustrative and non-limiting example, the upper pressure may comprise 200 Pa, and the pressure of the interior region of the capsule may decrease from 200 Pa to a target vacuum pressure of 100 Pa as the temperature of the interior region decreases to the target temperature of the cryogenic liquid. For example, if the cryogenic liquid comprises liquid nitrogen, the target temperature may comprise 77 K.

Once the interior region of the capsule is sealed at the target pressure and cooled to the target temperature, the empty capsule is prepared for loading with samples. Continuing at 925, method 900 couples the prepared capsule to the beam system. Coupling the prepared capsule to the beam system comprises connecting the prepared capsule to the beam system and equalizing pressure in the loading lock or airlock formed between the interior region of the capsule and the beam system. To that end, method 900 may, at 930, connect the prepared capsule to the autoloading system of the beam system. Connecting the prepared capsule to the autoloading system may comprise, for example, bringing a top exterior surface of an upper portion of the capsule, such as the sample loading system interface 350 of the capsule 302, into face-sharing contact with a respective component of the autoloading system. The top exterior surface of the capsule and the respective component of the autoloading system may be structurally adapted to form a seal when pressed together in face-sharing contact, as described hereinabove with regard to FIG. 3.

Further, at 932, method 900 may connect the prepared capsule to a hose, such as the hose 442. Continuing at 934, method 900 may open a hose valve of the hose to pump the outer capsule region of the capsule to the target pressure. By pumping the outer capsule region of the capsule to the target pressure, the airlock formed between the loading system and the capsule is pumped to the target pressure. Additionally, in examples wherein the capsule comprises an exterior valve, such as the valve 754 of the capsule 702, method 900 may open the exterior valve of the capsule prior to or while pumping the outer capsule region of the capsule so that the airlock formed by the outer capsule region and the outer pathway of the loading system coupling is evacuated. At 936, after the airlock including the outer capsule region reaches the target pressure, method 900 may then open the inner capsule valve to unseal the interior region of the capsule, and then at 938, method 900 may close the hose valve to stop pumping. The valves may be manually or automatically opened. Continuing at 940, method 900 may open the autoloading system valve, thereby enabling passage from the autoloading system to the interior region of the capsule. The autoloading system valve may comprise a valve of the autoloading system, such as the valve 454 for example. Thus, coupling the prepared capsule to the beam system may include selectively controlling valves as well as a pump to equalize the pressure in the loading lock between the beam system and the interior region of the capsule. In general, after equalizing the pressure in the airlock and the interior region, method 900 opens a first valve and then a second valve, the first valve and the second valve respectively comprising one of a capsule valve sealing the sample within a compartment of the transfer capsule or a loading system valve sealing the loading system from the airlock. For example, method 900 may first open the capsule valve and the open the autoloading system valve, as described hereinabove, or in other examples method 900 may first open the autoloading system valve and then the capsule valve.

At 945, method 900 loads the prepared capsule with sample(s) from the system. For example, the autoloading system may automatically retrieve the one or more samples from a stage of the beam system via a robotic arm by grasping a cartridge storing the one or more samples, extend the robotic arm with the grasped cartridge through the passageway between the autoloading system to the interior region of the capsule, and ungrasp or release the cartridge holding the one or more samples after inserting the cartridge into the sample holder, such as the sample holder 424 which may be configured to securely hold a cartridge such as a cassette storing a plurality of samples including the one or more samples, within the interior region of the capsule.

At 950, method 900 decouples the loaded capsule from the beam system. To decouple the loaded capsule from the beam system, method 900 may, at 952, close the autoloading system valve. Method 900 may then close the inner capsule valve at 954 to seal the interior region of the capsule, open the hose valve at 956 to vent the outer capsule region to atmosphere, and disconnect the loaded capsule at 958 from the autoloading system. The loaded capsule may then be transported away from the beam system with the samples securely held in the capsule at the target pressure and the target temperature. Method 900 then returns.

It should be appreciated that methods 800 and 900 may be implemented with the sample transfer capsule described herein, and that in some examples the methods 800 and 900 may be implemented with other sample transfer capsules without departing from the scope of the present disclosure. For example, in some examples wherein samples may be transported without cryogenic temperatures, the sample transfer capsule may not include a cryogen reservoir. As another example, a sample transfer capsule may be configured to actively cool the compartment storing samples to desired temperatures without cryogenic liquid. As yet another example, a sample transfer capsule may not include a dedicated cryogen reservoir, but cryogenic liquid may be poured into the interior region to cool the interior region to cryogenic temperatures, and then the cryogenic liquid may be removed prior to loading samples into the interior region.

Thus, systems, methods, and apparatuses are provided for contamination-free vacuum transfer of samples. In one example, an apparatus comprises a first portion including a compartment configured to store multiple samples held by a cartridge removably coupled to the compartment, a second portion fixedly attached to the first portion and configured to removably couple to a charged particle system, the second portion including a sample port for transferring the cartridge between the charged particle system and a position within the compartment, and a valve configured to seal the compartment at vacuum pressure during transport of the multiple samples between charged particle systems.

In a first example of the apparatus, the apparatus further comprises a reservoir configured to store cryogenic liquid, wherein the reservoir is in thermal communication with the compartment. In a second example of the apparatus optionally including the first example, the apparatus further comprises a cryogen port coupled to the reservoir for filling the reservoir with the cryogenic liquid. In a third example of the apparatus optionally including one or more of the first and second examples, the second portion further comprises a port in fluidic communication with the compartment to evacuate the compartment to the vacuum pressure when the valve is in the open position. In a fourth example of the apparatus optionally including one or more of the first through third examples, the reservoir is one of coaxial with and surrounding the compartment or adjacent to and non-coaxial with the compartment. In a fifth example of the apparatus optionally including one or more of the first through fourth examples, the first portion and the second portion are configured to receive a loading arm of the charged particle system, wherein the loading arm is configured to move the cartridge, via the sample port, between the compartment and a vacuum chamber of the charged particle system to load or unload the cartridge from the compartment. In a sixth example of the apparatus optionally including one or more of the first through fifth examples, the apparatus further includes a sample loading system interface adjacent to the sample port and configured to couple to and form a vacuum seal with sample loading systems of the charged particle systems including one or more of a dual-beam charged particle system and a single-beam charged particle system, wherein the sample loading system interface is configured to interface with a sample loading system of the charged particle system. In a seventh example of the apparatus optionally including one or more of the first through sixth examples, the valve is configured to obstruct a fluidic connection between the compartment and the sample port when the valve is in a closed position.

In another example, a charged particle system comprises a vacuum chamber, at least one column configured to generate and direct a charged particle beam toward a sample positioned within the vacuum chamber, and a sample loading system coupled to the vacuum chamber, the sample loading system configured to couple to a transfer capsule, the sample loading system further configured to move the sample between a position within the vacuum chamber and the transfer capsule via a sample port at an upper portion of the transfer capsule when the transfer capsule is coupled to the sample loading system, wherein multiple samples are held by a cartridge removably coupled to a sample holder at a bottom of a compartment in a lower portion of the transfer capsule, and the compartment is sealable at a vacuum pressure with a valve of the transfer capsule.

In a first example of the system, the sample loading system is configured to form an airlock between the transfer capsule and the sample loading system when the transfer capsule is coupled to the sample loading system. In a second example of the system optionally including the first example, the transfer capsule further includes a reservoir configured to store cryogenic liquid, and the valve is configured to seal the compartment in a closed position and to unseal the compartment in an open position, the valve adjustable between the closed position and the open position when the airlock is at the vacuum pressure. In a third example of the system optionally including one or more of the first and second examples, the system further comprises a second valve configured to selectively seal the airlock from the vacuum chamber. In a fourth example of the system optionally including one or more of the first through third examples, a pathway between the vacuum chamber and the compartment is formed for transferring the sample between the transfer capsule and the vacuum chamber when the valve is adjusted to the open position and the second valve is adjusted to an open position. In a fifth example of the system optionally including one or more of the first through fourth examples, the system further comprises a pump coupled to the port for evacuating one or more of the airlock and the compartment.

In yet another example, a method for sample transfer comprises coupling a transfer capsule to a loading system of a charged particle system, wherein multiple samples are stored in a compartment of the transfer capsule at a vacuum pressure and a cryogenic temperature, wherein the multiple samples are held by a cartridge removably coupled to a sample holder in the compartment, and loading at least one sample of the multiple samples from the transfer capsule to a vacuum chamber of the charged particle system via a sample port of the transfer capsule while maintaining the at least one sample at the vacuum pressure.

In a first example of the method, coupling the transfer capsule to the loading system of the charged particle system comprises connecting the transfer capsule to the loading system of the charged particle system to form an airlock between the transfer capsule and the loading system, pumping the airlock to the vacuum pressure, and opening a first valve and then a second valve, the first valve and the second valve respectively comprising one of a capsule valve sealing the sample within the compartment of the transfer capsule or a loading system valve sealing the loading system from the airlock. In a second example of the method optionally including the first example, loading the at least one sample from the transfer capsule to the vacuum chamber of the charged particle system while maintaining the at least one sample at the vacuum pressure comprises transporting the at least one sample from the compartment through the airlock to the vacuum chamber after opening the first valve and the second valve. In a third example of the method optionally including one or more of the first and second examples, the method further comprises decoupling the transfer capsule from the charged particle system after loading the at least one sample to the vacuum chamber. In a fourth example of the method optionally including one or more of the first through third examples, decoupling the transfer capsule from the charged particle system comprises closing the second valve, venting the compartment and the airlock, and disconnecting the transfer capsule from the loading system of the beam system. In a fifth example of the method optionally including one or more of the first through fourth examples, the method further comprises maintaining the transfer capsule in an upright position while the transfer capsule stores cryogenic liquid in a reservoir to provide the cryogenic temperature.

The description uses the phrases "an example," "various examples," and "some examples," each of which may refer to one or more of the same or different examples. Furthermore, the terms "comprising," "including," "having," and the like, as used with respect to examples of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

In view of the many possible examples to which the principles of the disclosed technology may be applied, it should be recognized that the illustrated examples are only preferred examples and should not be taken as limiting the scope of the disclosed technology. Rather, the scope of the disclosed technology is defined by the following claims.

We claim:

1. An apparatus, comprising:
a first portion including a compartment configured to store multiple samples held by a cartridge removably coupled to the compartment;
a second portion fixedly attached to the first portion and configured to removably couple to a charged particle system, the second portion including a sample port for transferring the cartridge between the charged particle system and a position within the compartment;
a valve configured to seal the compartment at vacuum pressure during transport of the multiple samples between charged particle systems; and
a reservoir configured to store cryogenic liquid, wherein the reservoir is in thermal communication with the compartment, wherein the sample is not in contact with the cryogenic liquid during the transport.

2. The apparatus of claim 1, further comprising a cryogen port coupled to the reservoir for filling the reservoir with the cryogenic liquid.

3. The apparatus of claim 1, wherein the second portion further comprises a port in fluidic communication with the compartment to evacuate the compartment to the vacuum pressure when the valve is in an open position.

4. The apparatus of claim 1, wherein the reservoir is one of coaxial with and surrounding the compartment or adjacent to and non-coaxial with the compartment.

5. The apparatus of claim 1, wherein the first portion and the second portion are configured to receive a loading arm of the charged particle system, wherein the loading arm is configured to move the cartridge, via the sample port, between the compartment and a vacuum chamber of the charged particle system to load or unload the cartridge from the compartment.

6. The apparatus of claim 1, wherein the apparatus further includes a sample loading system interface adjacent to the sample port and configured to couple to and form a vacuum seal with sample loading systems of the charged particle systems including one or more of a dual-beam charged particle system and a single-beam charged particle system, wherein the sample loading system interface is configured to interface with a sample loading system of the charged particle system.

7. The apparatus of claim 1, wherein the valve is configured to obstruct a fluidic connection between the compartment and the sample port when the valve is in a closed position.

8. A charged particle system, comprising:
a vacuum chamber;
at least one column configured to generate and direct a charged particle beam toward a sample positioned within the vacuum chamber; and
a sample loading system coupled to the vacuum chamber, the sample loading system configured to couple to a transfer capsule, the sample loading system further configured to move the sample between a position within the vacuum chamber and the transfer capsule via a sample port at a second portion of the transfer capsule when the transfer capsule is coupled to the sample loading system, wherein multiple samples are held by a cartridge removably coupled to a sample holder at a bottom of a compartment in a first portion of the transfer capsule, and the compartment is sealable at a vacuum pressure with a valve of the transfer capsule;
wherein the transfer capsule comprises:
the first portion including the compartment configured to store the multiple samples held by the cartridge removably coupled to the compartment;
the second portion fixedly attached to the first portion and configured to removably couple to the charged particle system, the second portion including the sample port for transferring the cartridge between the charged particle system and a position within the compartment; and
the valve configured to seal the compartment at vacuum pressure during transport of the multiple samples between charged particle systems; and
a reservoir configured to store cryogenic liquid, wherein the reservoir is in thermal communication with the compartment, wherein the sample is not in contact with the cryogenic liquid during the transport.

9. The system of claim 8, wherein the sample loading system is configured to form an airlock between the transfer capsule and the sample loading system when the transfer capsule is coupled to the sample loading system.

10. The system of claim 9, wherein the valve is configured to seal the compartment in a closed position and to unseal the compartment in an open position, the valve adjustable between the closed position and the open position when the airlock is at the vacuum pressure.

11. The system of claim 9, further comprising a second valve configured to selectively seal the airlock from the vacuum chamber.

12. The system of claim 11, wherein a pathway between the vacuum chamber and the compartment is formed for transferring the sample between the transfer capsule and the vacuum chamber when the valve is adjusted to an open position and the second valve is adjusted to an open position.

13. The system of claim 9, further comprising a pump coupled to the port for evacuating one or more of the airlock and the compartment.

14. A method for sample transfer, comprising:
coupling a transfer capsule to a loading system of a charged particle system, wherein multiple samples are stored in a compartment of the transfer capsule at a vacuum pressure and a cryogenic temperature, wherein the multiple samples are held by a cartridge removably coupled to a sample holder in the compartment; and
loading at least one sample of the multiple samples from the transfer capsule to a vacuum chamber of the charged particle system via a sample port of the transfer capsule while maintaining the at least one sample at the vacuum pressure,
wherein the transfer capsule comprises:
a first portion including the compartment configured to store the multiple samples held by the cartridge removably coupled to the compartment;
a second portion fixedly attached to the first portion and configured to removably couple to the charged particle system, the second portion including the sample port for transferring the cartridge between the charged particle system and a position within the compartment; and
a valve configured to seal the compartment at vacuum pressure during transport of the multiple samples between charged particle systems; and
a reservoir configured to store cryogenic liquid, wherein the reservoir is in thermal communication with the compartment, wherein the sample is not in contact with the cryogenic liquid during the transport.

15. The method of claim 14, wherein coupling the transfer capsule to the loading system of the charged particle system comprises:

connecting the transfer capsule to the loading system of the charged particle system to form an airlock between the transfer capsule and the loading system;

pumping the airlock to the vacuum pressure; and opening a first valve and then a second valve, the first valve and the second valve respectively comprising one of a capsule valve sealing the sample within the compartment of the transfer capsule or a loading system valve sealing the loading system from the airlock.

16. The method of claim 15, wherein loading the at least one sample from the transfer capsule to the vacuum chamber of the charged particle system while maintaining the at least one sample at the vacuum pressure comprises transporting the at least one sample from the compartment through the airlock to the vacuum chamber after opening the first valve and the second valve.

17. The method of claim 15, further comprising decoupling the transfer capsule from the charged particle system after loading the at least one sample to the vacuum chamber.

18. The method of claim 17, wherein decoupling the transfer capsule from the charged particle system comprises:

closing the second valve;

venting the compartment and the airlock; and disconnecting the transfer capsule from the loading system of the charged particle system.

19. The method of claim 14, further comprising maintaining the transfer capsule in an upright position while the transfer capsule stores the cryogenic liquid in the reservoir to provide the cryogenic temperature.

* * * * *